(12) United States Patent
Tanaka et al.

(10) Patent No.: US 12,745,579 B2
(45) Date of Patent: Sep. 22, 2026

(54) PROCESSING METHOD OF BONDED WAFER

(71) Applicant: DISCO CORPORATION, Tokyo (JP)

(72) Inventors: Hayato Tanaka, Tokyo (JP); Hayato Iga, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 422 days.

(21) Appl. No.: 18/594,398

(22) Filed: Mar. 4, 2024

(65) Prior Publication Data

US 2024/0304448 A1 Sep. 12, 2024

(30) Foreign Application Priority Data

Mar. 7, 2023 (JP) ................................ 2023-034252

(51) Int. Cl.
*H10P 34/42* (2026.01)
*H10P 52/40* (2026.01)

(52) U.S. Cl.
CPC ............ *H10P 34/42* (2026.01); *H10P 52/402* (2026.01)

(58) Field of Classification Search
CPC ........ H10P 34/42; H10P 52/402; H10P 52/00; H10P 90/123; H10P 54/00; H10P 10/128; H10P 90/124; H10P 90/12; H10P 90/128; H10P 10/12; B23K 26/067; B23K 26/53; B23K 2103/56
See application file for complete search history.

(56) References Cited

U.S. PATENT DOCUMENTS

2010/0304151 A1* 12/2010 Tuennermann ......... B29C 65/16 428/428
2022/0040800 A1* 2/2022 Mori .................. B23K 26/0884

FOREIGN PATENT DOCUMENTS

JP 2010225976 A 10/2010
JP 2016096295 A 5/2016

* cited by examiner

*Primary Examiner* — Wasiul Haider
(74) *Attorney, Agent, or Firm* — Greer Burns & Crain Ltd.

(57) ABSTRACT

A method of processing a bonded wafer includes a modified layer forming step of applying a laser beam to a first wafer while positioning a focused spot FP of the laser beam within the first wafer to form a modified layer and cracks developed from the modified layer and extending toward an outer circumferential portion of the first wafer along the bonding layer, and a step of grinding the reverse side of the first wafer to thin it. In the modified layer forming step, a plurality of spaced modified layers are formed radially inwardly from the outer circumferential portion of the first wafer, and a line interconnecting the modified layers forms a depression angle ranging from 30 to 80 degrees toward the outer circumferential portion, the modified layers being joined to each other by cracks to form a removal initiating point for removing a chamfered outermost circumferential edge.

5 Claims, 9 Drawing Sheets

FIG. 1A
FIG. 1B
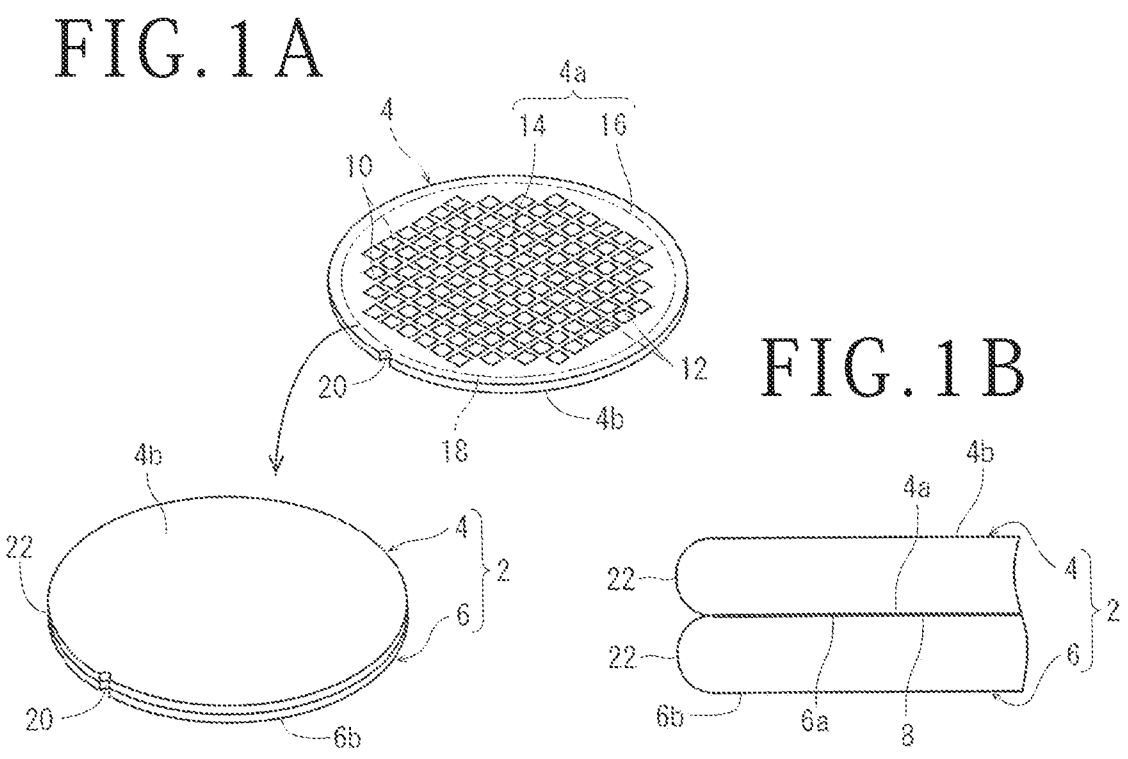
FIG. 2
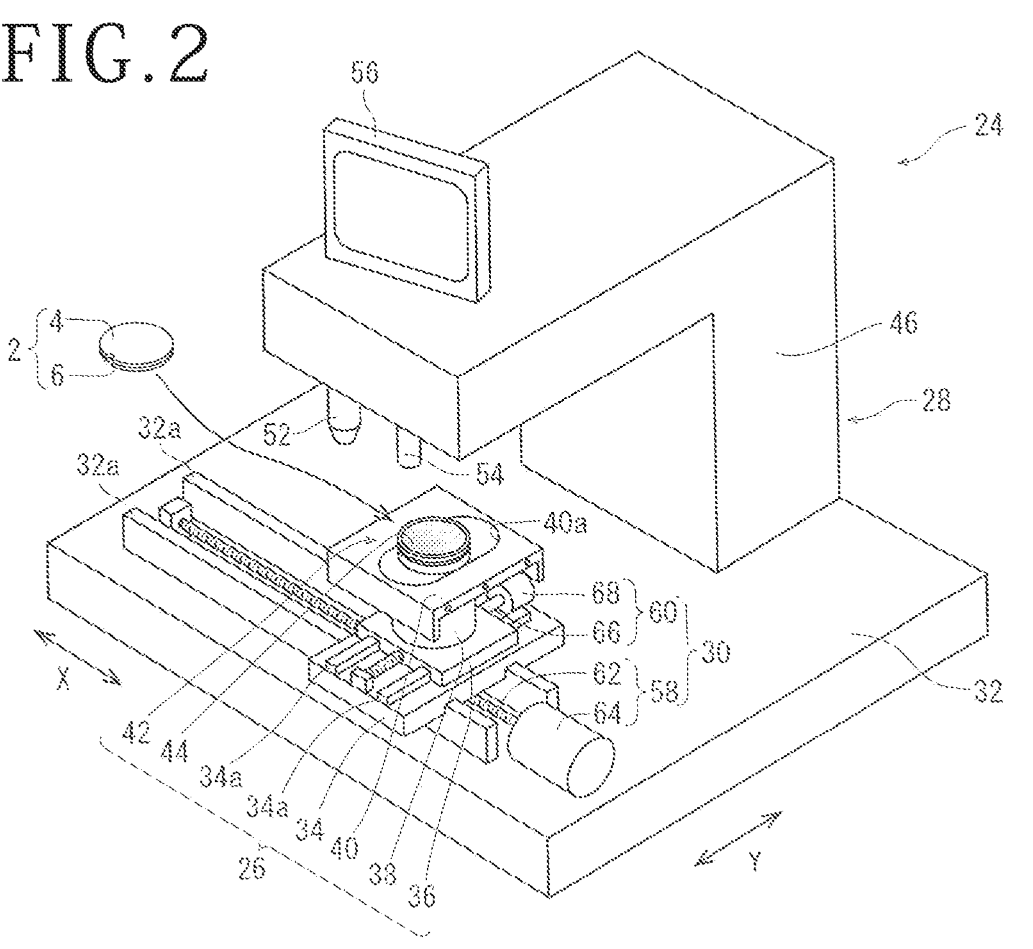

2
4
LB
4b
72
74
22
70
74
74
6a
74
72
8
4a
22
6b
6

PROCESSING METHOD OF BONDED WAFER

BACKGROUND OF THE INVENTION

Field of the Invention

The present invention relates to a method of processing a bonded wafer including a first wafer and a second wafer that are bonded to each other by a bonding layer interposed therebetween, the first wafer having on a face side thereof a device region where a plurality of devices are fabricated and an outer circumferential excessive region surrounding the device region and having a chamfered outermost circumferential edge, and the face side being bonded to the second wafer by the bonding layer.

Description of the Related Art

Bonded wafers that have a plurality of devices such as integrated circuits (ICs) or large scale integration (LSI) circuits disposed in respective areas demarcated by a plurality of projected dicing lines are divided into individual device chips by a dicing apparatus. The device chips will be used in electric appliances such as cellular phones, personal computers, etc.

In order to enhance performance of devices on device chips, it has been the occasional practice in the art to bond one wafer that has a pattern formed thereon by a surface activating process to another wafer and thin down one of the wafers by grinding.

The wafer to be thinned down has devices on a face side thereof. When the wafer is thin down, a reverse side thereof that is opposite the face side is ground until the chamfered edge of the outer circumferential excessive region of the wafer turns into a sharp knife edge. The knife edge is problematic in that it is likely to injure an operator and develop cracks into the bonded wafer, tending to cause damage to the devices in the bonded wafer.

As a solution to the above problems, there has been proposed a technology for preventing a knife edge from being formed on an outer circumferential portion of a bonded wafer by removing a chamfered edge therefrom by a cutting blade or a grindstone positioned at the outer circumferential portion when the reverse side of one of the wafers is ground (see, for example, JP2010-225976 A and JP2016-096295 A).

SUMMARY OF THE INVENTION

However, a process of removing the chamfered edge with the cutting blade or the grindstone is highly time-consuming and hence poor in productivity.

In addition, if voids are present in an outer circumferential portion of the bonding layer in the bonded wafer, then the voids are liable to damage the bonded wafer when the chamfered edge is removed or when the bonded wafer is ground.

It is therefore an object of the present invention to provide a method of processing a bonded wafer to remove a chamfered edge efficiently therefrom without causing damage to the bonded wafer.

In accordance with an aspect of the present invention, there is provided a method of processing a bonded wafer including a first wafer and a second wafer that are bonded to each other by a bonding layer interposed therebetween, the first wafer having on a face side thereof a device region where a plurality of devices are fabricated and an outer circumferential excessive region surrounding the device region and having a chamfered outermost circumferential edge, and the face side being bonded to the second wafer by the bonding layer. The method includes a modified layer forming step of applying a laser beam having a wavelength transmittable through the first wafer to the first wafer from a reverse side thereof while positioning a focused spot of the laser beam within the first wafer to form a modified layer in the first wafer and cracks developed from the modified layer and extending toward an outer circumferential portion of the first wafer along the bonding layer, and, after the modified layer forming step, a grinding step of holding the second wafer on a chuck table and grinding the reverse side of the first wafer to thin down the first wafer, wherein, in the modified layer forming step, a plurality of modified layers are formed in the first wafer at positions spaced in a thicknesswise direction of the first wafer radially inwardly from the outer circumferential portion of the first wafer, and a line interconnecting the modified layers forms a depression angle ranging from 30 to 80 degrees toward the outer circumferential portion of the first wafer, the modified layers being joined to each other by cracks to form a removal initiating point for removing the chamfered outermost circumferential edge.

Preferably, a plurality of the modified layers are spaced at an interval in a range from 10 to 380 μm thicknesswise across the first wafer.

Preferably, in the modified layer forming step, a plurality of the modified layers are formed at positions spaced parallel to a plane of the first wafer radially inwardly from the outer circumferential portion of the first wafer, and the cracks are developed in and along the bonding layer toward the outer circumferential portion of the first wafer. Preferably, the modified layers spaced parallel to the plane of the first wafer are spaced at an interval in a range from 450 to 800 μm along the plane of the first wafer.

Preferably, the focused spot of the laser beam includes multi-focused spots to form the modified layer.

According to the present invention, in the modified layer forming step, a plurality of modified layers are each formed by the multi-focused spots and spaced in a thicknesswise direction across the first wafer and radially inwardly from the outer circumferential portion of the first wafer, and a line interconnecting the plurality of modified layers forms a depression angle ranging from 30 to 80 degrees toward the outer circumferential portion of the first wafer with a line parallel to the plane of the bonded wafer, the plurality of modified layers being interconnected by cracks, and a removal initiating point for removing the chamfered outermost circumferential edge is formed. Consequently, the method of processing a bonded wafer according to the present invention is able to remove the chamfered outer circumferential edge more efficiently than the conventional removing process.

According to the present invention, furthermore, even if voids are present in bonded surfaces of the bonded wafer, the voids can be removed together with the chamfered outer circumferential edge, so that the bonded wafer will not be damaged.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 1A is a perspective view of a bonded wafer;

FIG. 1B is an enlarged fragmentary side elevational view of the bonded wafer illustrated in FIG. 1A;

FIG. 2 is a perspective view of a laser processing apparatus;

DETAILED DESCRIPTION OF THE PREFERRED EMBODIMENT

Figure 3:
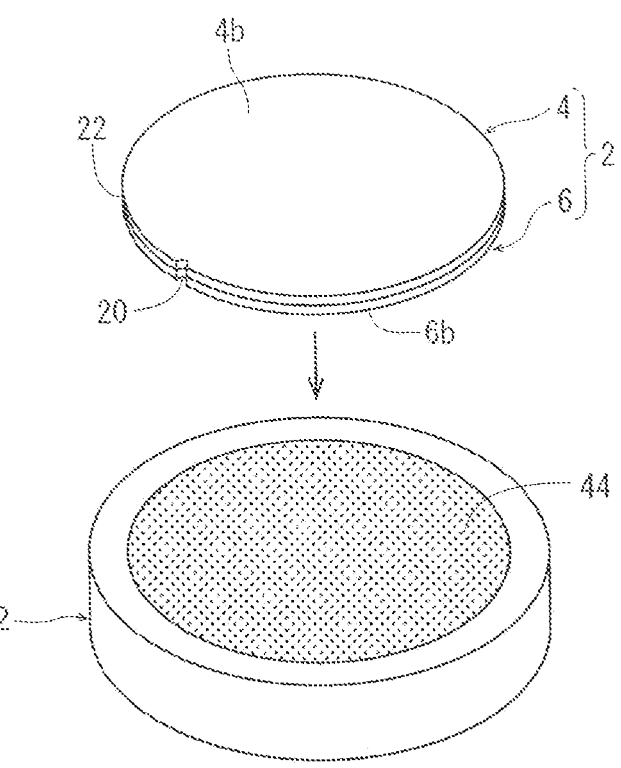
FIG. 3 is a perspective view illustrating the manner in which the bonded wafer is placed onto a chuck table of the laser processing apparatus illustrated in FIG. 2.

A method of processing a bonded wafer according to a preferred embodiment of the present invention will be described hereinbelow with reference to the accompanying drawings.

FIGS. 1A and 1B illustrates in perspective a bonded wafer 2 that can be processed by the method of processing a bonded wafer according to the present embodiment. As illustrated in FIG. 1A, the bonded wafer 2 includes a first wafer 4 and a second wafer 6 that are bonded to each other by a bonding layer 8 (see FIG. 1B) interposed therebetween.

The first wafer 4, shaped as a circular plate, has a thickness of approximately 700 μm and is made of a semiconductor material such as silicon, for example. As illustrated in FIG. 1A, the first wafer 4 has on a face side 4*a* thereof a device region 14 where a plurality of devices 10 such as IC or LSI circuits are constructed in respective areas demarcated by a grid of projected dicing lines 12 and an outer circumferential excessive region 16 surrounding the device region 14. In FIG. 1A, an annular boundary line 18 is depicted by the two-dot-and-dash line as a marking dividing the device region 14 and the outer circumferential excessive region 16 from each other. The annular boundary line 18 is hypothetically added for illustrative purposes in FIGS. 1A and 1*s* not actually present on the face side 4*a* of the first wafer 4.

The outer circumferential excessive region 16 of the first wafer 4 has a notch 20 defined in its outer circumferential end portion as an indicator of the crystal orientation of the first wafer 4. As illustrated in FIG. 1B, the outer circumferential end portion of the outer circumferential excessive region 16 is chamfered into a curbed chamfered edge 22.

The second wafer 6 affixed to the first wafer 4 is essentially identical in structure of the first wafer 4 and will be omitted from detailed description below.

To form the bonded wafer 2, the face side 4*a* of the first wafer 4 is bonded to a face side 6*a* of the second wafer 6 by the bonding layer 8 that includes an appropriate adhesive. At this time, the notch 20 of the first wafer 4 is positioned in alignment with a notch 20 of the second wafer 6, aligning the crystal orientations of the first and second wafers 4 and 6 with each other. The bonded wafer 2 to be processed by the method of processing a bonded wafer according to the present embodiment is formed in this manner.

Various other bonded wafers can be processed by the method of processing a bonded wafer according to the present embodiment. For example, a bonded wafer in which the face side 4*a* of the first wafer 4 and a reverse side 6*b* of the second wafer 6 are bonded to each other by the bonding layer 8 can be processed by the method according to the present embodiment.

According to the present embodiment, the method includes a modified layer forming step that is first carried out on the bonded wafer 2. In the modified layer forming step, specifically, a laser beam having a wavelength transmittable through the first wafer 4 is applied to the first wafer 4 from a reverse side 4*b* thereof while its focused spot is being positioned in the first wafer 4, forming a modified layer in the first wafer 4 and cracks developed from the modified layer and extending radially, along the bonding layer 8, with respect to the first wafer 4.

The modified layer forming step may be performed by a laser processing apparatus 24 illustrated in FIG. 2. As illustrated in FIG. 2, the laser processing apparatus 24 includes a holding unit 26 for holding the bonded wafer 2 thereon, a laser beam applying unit 28 for applying the laser beam to the bonded wafer 2 held on the holding unit 26, and a feed mechanism 30 for moving the holding unit 26 and the laser beam applying unit 28 relatively to each other.

The holding unit 26 includes an X-axis movable plate 34 supported on an upper surface of a base 32 for movement along an X-axis, a Y-axis movable plate 36 supported on an upper surface of the X-axis movable plate 34 for movement along a Y-axis, a support post 38 fixedly mounted on an upper surface of the Y-axis movable plate 36, and a cover plate 40 fixedly mounted on the upper end of the support post 38.

The X-axis is indicated by an arrow X in FIG. 2, whereas the Y-axis is indicated by an arrow Y and extends perpendicularly to the X-axis. The X-axis and the Y-axis jointly define an XY plane that lies essentially horizontally.

The cover plate 40 has an oblong hole 40*a* defined therein, which extends along the Y-axis. A chuck table 42 extends upwardly through the oblong hole 40*a* and is rotatably mounted on the upper end of the support post 38. A circular porous suction chuck 44 that is fluidly connected to suction means, not depicted, is disposed on the upper end of the chuck table 42.

The holding unit 26 holds the bonded wafer 2 thereon by having the suction means generate a suction force and apply the suction force to an upper surface of the suction chuck 44, keeping the bonded wafer 2 securely under suction on the upper surface of the suction chuck 44. The chuck table 42 is rotatable about its vertical central axis by a chuck table motor, not depicted, housed in the support post 38.

Figure 6:
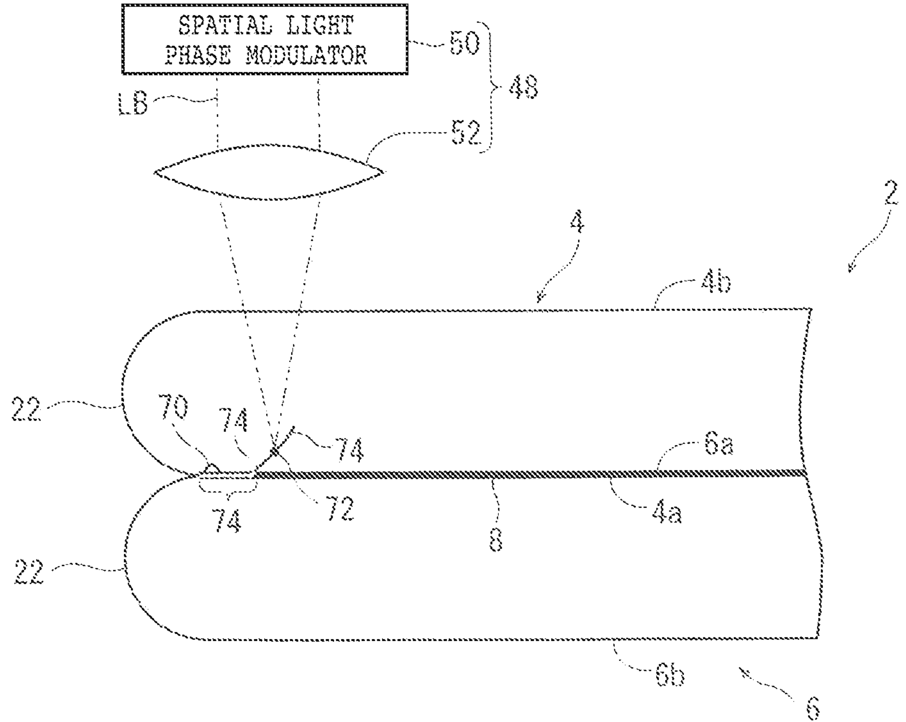
FIG. 6 is an enlarged fragmentary side elevational view of the bonded wafer at the time a modified layer is formed therein.
Figure 7:
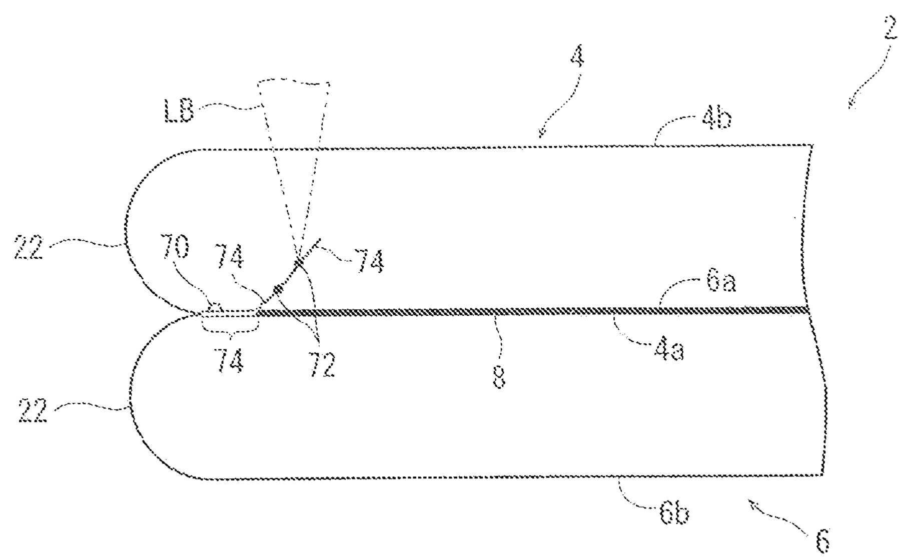
FIG. 7 is an enlarged fragmentary side elevational view of the first wafer at the time a plurality of modified layers are formed therein, which are spaced in a thicknesswise direction across the bonded wafer and radially inwardly from an outer circumferential portion of the bonded wafer.

The laser beam applying unit 28 includes a housing 46 having a vertical portion extending upwardly from the upper surface of the base 32 and a vertical portion extending substantially horizontally from the upper end of the vertical portion. As illustrated in FIGS. 2, 6, and 7, the housing 46 encloses a laser oscillator, not depicted, for emitting a pulsed laser beam LB having a wavelength transmittable through the first wafer 4 and a multi-focused beam spot producing unit 48 (see FIG. 6) for dividing the pulsed laser beam LB emitted from the laser oscillator into laser beam branches and converging the laser beam branches into respective focused spots.

The multi-focused beam spot producing unit 48 has a spatial light phase modulator 50 (see FIG. 6) that can be made of liquid crystal on silicon (LCOS) and a beam condenser 52 (see FIGS. 2 and 6) mounted on a lower surface of the distal end of the horizontal portion of the housing 46. The spatial light phase modulator 50 performs spatial phase modulation on the pulsed laser beam LB. The beam condenser 52 converges the laser beam LB that has been modulated by the spatial light phase modulator 50. In FIG. 6, the beam condenser 52 is schematically illustrated as a condensing lens.

The multi-focused beam spot producing unit 48 divides the pulsed laser beam LB into a plurality of laser beam branches, also denoted by LB, by way of diffraction and converges the laser beam branches LB into respective focused spots FP (see FIG. 12), i.e., multi-focused spots FP, at respective desired positions. According to the present embodiment, the multi-focused beam spot producing unit 48 can produce a plurality of, e.g., eight, focused spots FP spaced vertically and horizontally. The multi-focused beam spot producing unit 48 is also able to form a single focused spot FP.

As illustrated in FIG. 2, an image capturing unit 54 is mounted on the lower surface of the distal end of the horizontal portion of the housing 46 at a position laterally spaced from the beam condenser 52. A display monitor 56 for displaying images captured by the image capturing unit 54 is mounted on an upper surface of the horizontal portion of the housing 46.

The image capturing unit 54 should include an ordinary image capturing device (CCD) for capturing an image of the bonded wafer 2 with a visible light beam, an infrared ray applying means for irradiating the bonded wafer 2 with infrared rays that are applied to and transmitted through the bonded wafer 2, an optical system for catching the infrared rays applied to the bonded wafer 2 by the infrared ray applying means, and an image capturing device (infrared CCD) for outputting an electric signal representing the infrared rays caught by the optical system.

As illustrated in FIG. 2, the feed mechanism 30 includes an X-axis feed mechanism 58 for moving the chuck table 42 along the X-axis and a Y-axis feed mechanism 60 for moving the chuck table 42 along the Y-axis.

The X-axis feed mechanism 58 has a ball screw 62 coupled to the X-axis movable plate 34 and extending along the X-axis and an electric motor 64 for rotating the ball screw 62 about its central longitudinal axis. The X-axis feed mechanism 58 operates by converting rotary motion of the electric motor 64 into linear motion with the ball screw 62 and transmitting the linear motion to the X-axis movable plate 34, moving the X-axis movable plate 34 along the X-axis on and along a pair of guide rails 32*a* mounted on the base 32. When the X-axis movable plate 34 is moved along the X-axis, the chuck table 42 is also moved along the X-axis.

The Y-axis feed mechanism 60 has a ball screw 66 coupled to the Y-axis movable plate 36 and extending along the Y-axis and an electric motor 68 for rotating the ball screw 66 about its central longitudinal axis. The Y-axis feed mechanism 60 operates by converting rotary motion of the electric motor 68 into linear motion with the ball screw 66 and transmitting the linear motion to the Y-axis movable plate 36, moving the Y-axis movable plate 36 along the Y-axis on and along a pair of guide rails 34*a* mounted on the X-axis movable plate 34. When the Y-axis movable plate 36 is moved along the Y-axis, the chuck table 42 is also moved along the Y-axis.

In the modified layer forming step, as illustrated in FIG. 3, the bonded wafer 2 with the reverse side 4*b* of the first wafer 4 facing upwardly is placed on the suction chuck 44 on the chuck table 42. Then, the suction means is actuated to generate a suction force and apply the suction force to the upper surface of the suction chuck 44, holding the bonded wafer 2 under suction on the suction chuck 44.

Then, the feed mechanism 30 is actuated to position the bonded wafer 2 directly below the image capturing unit 54. Then, the image capturing unit 54 is energized to capture an image of the bonded wafer 2. Based on the captured image of the bonded wafer 2, a positional relation between the beam condenser 52 and the bonded wafer 2 is adjusted to position the focused spots FP of the laser beam branches LB within the first wafer 4 radially inwardly of an outer circumferential edge thereof. Specifically, the focused spots FP of the laser beam branches LB are positioned within the outer circumferential excessive region 16 of the first wafer 4 radially inwardly of the notch 20 and the chamfered edge 22.

The bonded wafer 2 has bonded surfaces including an annular area that is spaced 2 to 3 mm radially inwardly from outer circumferential edges of the bonded surfaces. Since the annular area tends to contain voids, the focused spots FP should preferably be positioned radially inwardly of the annular area.

In case the image capturing unit 54 includes an infrared CCD, as described above, a void detecting step may be carried out on the basis of an infrared image captured by the infrared CCD before the positional relation between the beam condenser 52 and the bonded wafer 2 is adjusted.

Figure 4:
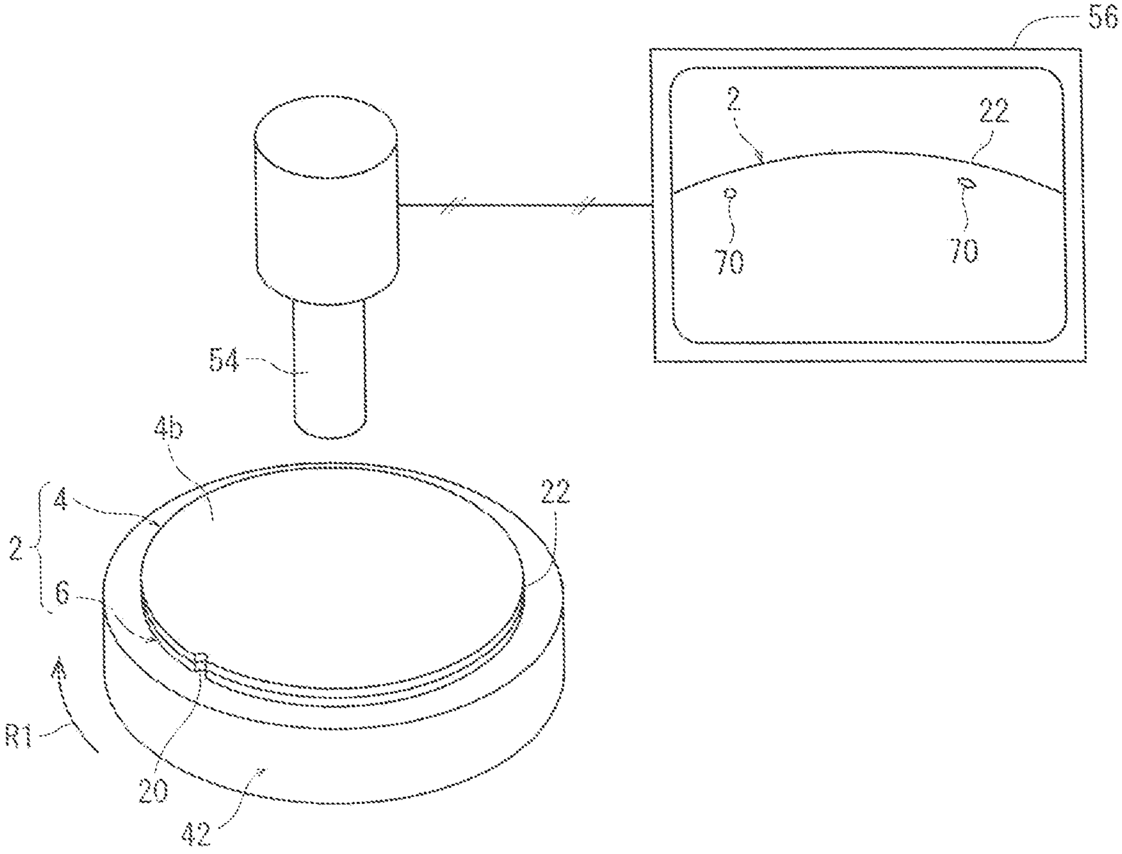
FIG. 4 is a perspective view illustrating a void detecting step.

In the void detecting step, as illustrated in FIG. 4, while the chuck table 42 with the bonded wafer 2 held under suction thereon is being rotated in the direction indicated by an arrow R1, the infrared CCD captures an infrared image of the outer circumferential excessive region 16 of the bonded wafer 2, detecting the positions of voids 70. By thus detecting the positions of voids 70, the focused spots FP can reliably be positioned radially inwardly of the voids 70.

Figure 5:
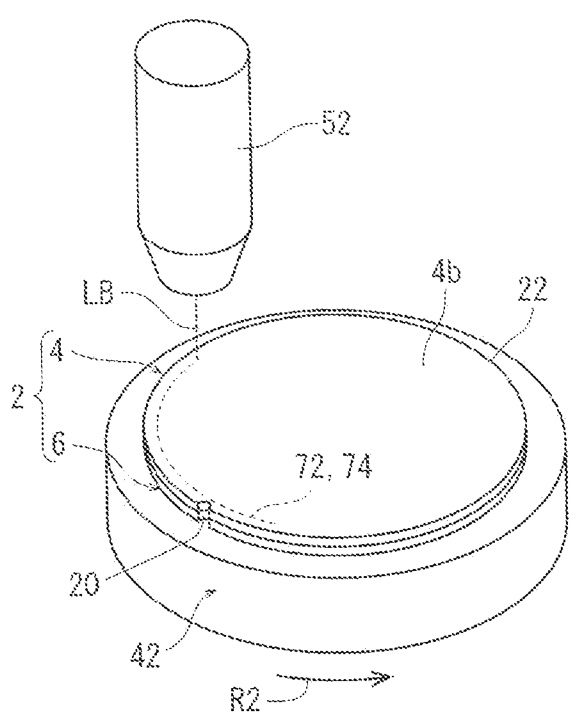
FIG. 5 is a perspective view illustrating a modified layer forming step.

After the focused spots FP have been positioned, as illustrated in FIG. 5, the beam condenser 52 applies the pulsed laser beam branches LB having a wavelength transmittable to the first wafer 4 while the chuck table 42 is being rotated in the direction indicated by an arrow R2.

The pulsed laser beam branches LB may be applied to the first wafer 4 while the chuck table 42 is making one revolution (360°). Alternatively, the pulsed laser beam branches LB may be applied to the first wafer 4 while the chuck table 42 is making two or more revolutions. In other words, the pulsed laser beam branches LB may be applied once or twice or more to the first wafer 4 at each location thereon.

As illustrated in FIG. 6, the pulsed laser beam branches LB thus applied to the first wafer 4 form in the first wafer 4 an annular modified layer 72 along the outer circumference of the bonded wafer 2 and annular cracks 74 developed from the annular modified layer 72 and extending radially along the bonding layer 8.

According to the present embodiment, it is important that a plurality of modified layers 72 be formed at positions spaced in a thicknesswise direction across the bonded wafer 2 and radially inwardly from the outer circumferential portion of the bonded wafer 2, a line interconnecting the modified layers 72 form a depression angle ranging from 30 to 80 degrees toward the outer circumferential portion of the bonded wafer 2 with a line parallel to the plane of the bonded wafer 2, and the modified layers 72 be interconnected by cracks 74, forming a removal initiating point for removing the chamfered edge 22.

Figure 8:
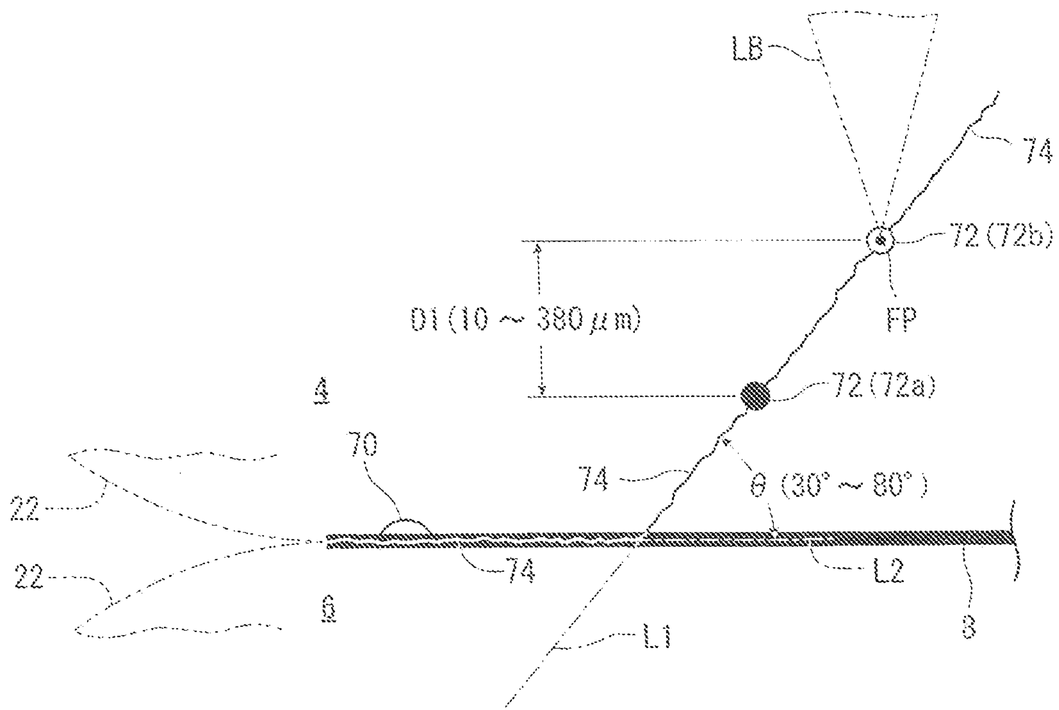
FIG. 8 is an enlarged fragmentary side elevational view of a portion of the bonded wafer illustrated in FIG. 7.

With reference to FIGS. 7 and 8, after the annular modified layer 72 has been formed in the first wafer 4 in the manner described above, the feed mechanism 30 is actuated to adjust the positional relation between the beam condenser 52 and the bonded wafer 2.

Figures 9, 10:
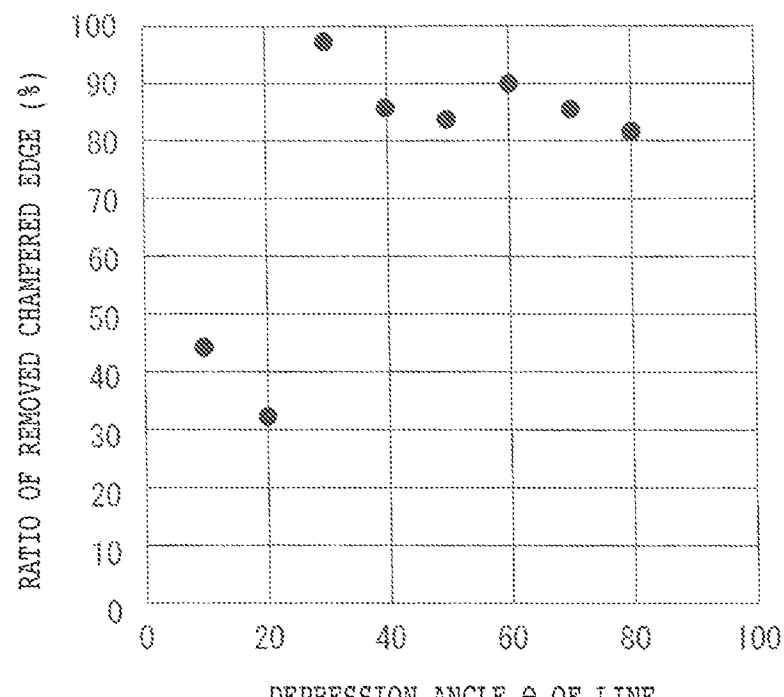
FIG. 9 is a graph representing a relation between a depression angle of a line interconnecting a plurality of modified layers and a ratio of a removed chamfered edge.
FIG. 10 is an enlarged fragmentary side elevational view of the bonded wafer at the time a plurality of modified layers are formed that are spaced parallel to a surface of the bonded wafer and radially inwardly from an outer circumferential portion of the bonded wafer.

At this time, the focused spots FP of the laser beam branches LB are positioned in the first wafer 4 radially inwardly and upwardly of the previously formed modified layer 72. Specifically, as illustrated in FIG. 9, it is preferable to adjust the position of the focused spots FP of the laser beam branches LB such that a line L3 interconnecting the upper end of the previously formed modified layer 72, i.e., the first modified layer 72, and the lower end of a modified layer 72 to be formed next, i.e., a second modified layer 72, will form a depression angle θ' ranging from 30 to 80 degrees (30°≤θ'≤80°) toward the outer circumferential portion of the bonded wafer 2 with the line L2 parallel to a plane of the bonded wafer 2. A line L2 is parallel to a plane of the bonded wafer 2.

After the focused spots FP have been positioned, the beam condenser 52 applies the pulsed laser beam branches LB to the first wafer 4 while the chuck table 42 is being rotated at a predetermined rotational speed. The pulsed laser beam branches LB thus applied to the first wafer 4 form therein an annular second modified layer 72 radially inwardly and upwardly of the first modified layer 72 and annular cracks 74 developed from the second annular modified layer 72.

Since the cracks 74 developed from the lower end of the second modified layer 72 extend obliquely radially outwardly to the first modified layer 72, the cracks 74 interconnect the first modified layer 72 and the second modified layer 72.

The formation of the second modified layer 72 causes the cracks 74 in the bonding layer 8 to extend radially outwardly toward the outer circumferential portion of the bonded wafer 2. Therefore, the second modified layer 72 thus formed can make the cracks 74 in the bonding layer 8 more effective as a removal initiating point.

The reason why it is important that the depression angle θ be adjusted to the range from 30 to 80 degrees will be described below. FIG. 9 illustrates results of an experiment on the depression angle of the line L1 interconnecting the modified layers 72 and the ratio of a removed chamfered edge 22 in the case where the focused spot FP that has formed the first modified layer **72*a* and the focused spot FP that has formed the second modified layer 72*b*** are spaced from each other by a linear distance of 500 μm. Experimental conditions other than the distance between the focused spots FP are as follows.

Wavelength of the pulsed laser beams: 1342 nm
Repetitive frequency: 60 kHz
Average output power: 2.4 W
Number of focused spots: 1 (focused spot)
Position of the first focused spot: 3 mm radially inwardly from the outer circumferential portion of the first wafer
Number of times laser beams are applied: twice at each location
Rotational speed of the chuck table: 107.3 deg/s (peripheral velocity of 280 mm/s)
Diameters of the first and second wafers: 300 mm
Materials of the first and second wafers: silicon As illustrated in FIG. 9, when the depression angle θ was in the range from 30 to 80 degrees, it was possible to remove most (80% or higher) of the chamfered edge 22 by carrying out a grinding step to be described later. It is considered that the removal of most of the chamfered edge was made possible because the cracks 74 in the bonding layer 8 are sufficiently developed when the second modified layer **72*b*** is formed.

When the depression angle θ was smaller than 30 degrees, a ratio of a removed chamfered edge 22 was lower than 50%. It is considered that if the depression angle θ is smaller than 30 degrees, then since cracks 74 tend to extend from the second modified layer **72*b* in a direction (lateral direction) parallel to the plane of the bonded wafer 2, cracks 74 in the bonding layer 8 are not sufficiently developed when the second modified layer 72*b*** is formed.

When the depression angle θ was larger than 80 degrees, though not depicted in FIG. 9, cracks 74 were liable to extend from the second modified layer **72*b* in a thicknesswise direction (vertical direction) across the bonded wafer 2, and reached the second wafer 6 beyond the bonding layer 8, damaging the second wafer 6. If the depression angle θ was larger than 90 degrees, then cracks in the joining layer 8 are likely to extend toward a center of the bonded wafer 2, possibly causing damage to the devices 10**.

Consequently, by adjusting the line L1 interconnecting the modified layers 72 to form the depression angle θ in the range from 30 to 80 degrees toward the outer circumferential portion of the bonded wafer 2, it is possible to make cracks 74 in the bonding layer 8 sufficiently developed and also to prevent unnecessary cracks from being produced.

In order to reliably join the first modified layer **72*a* and the second modified layer 72*b* to each other with the cracks 74, it is preferable to keep the distance D1 between the first and second modified layers 72 thicknesswise across the bonded wafer 2 in a range from 10 to 380 μm (10 μm≤D1**≤380 μm).

FIGS. 7 and 8 illustrate an example in which two modified layers 72 are formed at positions spaced thicknesswise across the bonded wafer 2 and radially inwardly from the outer circumferential portion of the bonded wafer 2. However, three or more modified layers 72 may be formed at positions spaced thicknesswise across the bonded wafer 2 and radially inwardly from the outer circumferential portion of the bonded wafer 2.

In the modified layer forming step, a plurality of modified layers 72 may be formed at positions parallel to the plane of the bonded wafer 2 and radially inwardly from the outer circumferential portion of the bonded wafer 2, with cracks 74 developed therefrom toward the bonding layer 8 and toward the outer circumferential portion of the bonded wafer 2.

A process of forming a plurality of modified layers 72 at positions parallel to the plane of the bonded wafer 2 will be described below with reference to FIGS. 10 and 11. After the plurality of modified layers 72 have been formed thicknesswise across the bonded wafer 2 and radially inwardly from the outer circumferential portion of the bonded wafer 2, the feed mechanism 30 is actuated to adjust a positional relation between the beam condenser 52 and the bonded wafer 2.

At this time, the focused spot FP of the laser beam LB is positioned in the first wafer 4 radially inwardly of the previously formed modified layers 72 (the plurality of modified layers 72 formed thicknesswise). Specifically, the focused spot FP of the laser beam LB is positioned a position that is spaced from the previously formed modified layer 72 so far that the laser beam LB to be applied will not be irregularly reflected by the cracks 74 extending from the previously formed modified layer 72.

However, if the focused spot FP is spaced too far from the previously formed modified layer 72, then it would make a plurality of modified layers 72 formed at positions parallel to the plane of the bonded wafer 2 less effective. Therefore, care should be taken not to space the focused spot FP too far from the previously formed modified layer 72.

It is preferable to keep the distance D2 (see FIG. 11) between a plurality of modified layers 72 formed at positions parallel to the plane of the bonded wafer 2 in a range from 450 to 800 μm (450 μm≤D2≤800 μm) along the plane of the bonded wafer 2. The focused spot FP to be applied to form the subsequent modified layer 72 may be identical in vertical position, i.e., thicknesswise position in the bonded wafer 2, to the first modified layer 72*a*.

After the focused spot FP has been positioned, the beam condenser 52 applies the pulsed laser beam LB to the first wafer 4 while the chuck table 42 is being rotated at a predetermined rotational speed. The pulsed laser beam LB thus applied to the first wafer 4 forms therein an annular modified layer 72, i.e., a third modified layer 72*c*, radially inwardly of the previously formed modified layers 72, i.e., the first modified layer 72*a* and the second modified layer 72*b*, and annular cracks 74 developed from the third modified layer 72*c* and extending along the bonding layer 8 toward the outer circumferential portion of the bonded wafer 2.

Figure 11:
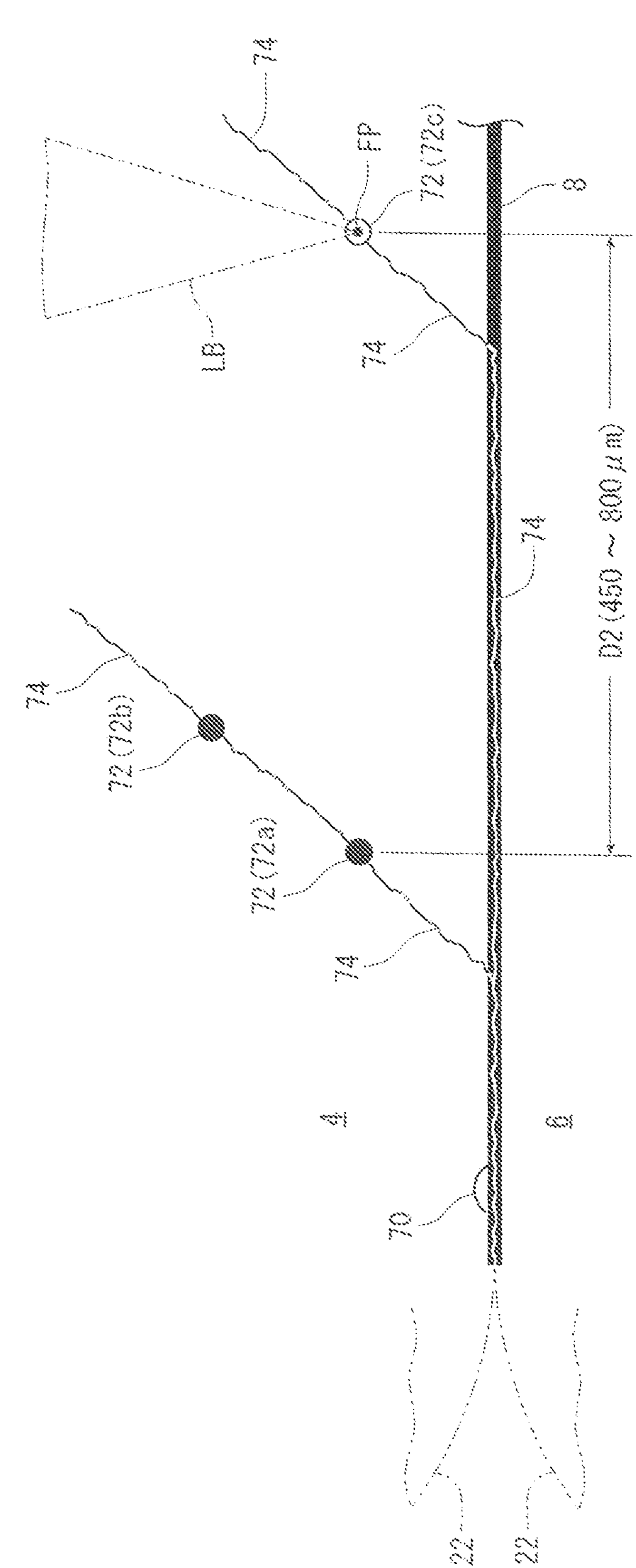
FIG. 11 is an enlarged fragmentary side elevational view of a portion of the bonded wafer illustrated in FIG. 10.

As illustrated in FIGS. 10 and 11, the cracks 74 extend from the third modified layer 72*c* to the bonding layer 8 obliquely (obliquely downwardly) toward the outer circumferential portion of the bonded wafer 2, and the cracks 74 are developed in and along the bonding layer 8 toward the outer circumferential portion of the bonded wafer 2.

The cracks 74 produced in the bonding layer 8 by the third modified layer 72*c* are joined to the cracks 74 produced in the bonding layer 8 by the first modified layer 72*a*. As the cracks 74 in the bonding layer 8 extend to the outer circumferential portion of the bonded wafer 2, the cracks 74 in the bonding layer 8 can act as a more appropriate removal initiating point for removing the chamfered edge 22.

After the third modified layer 72*c* has been formed, it is preferable to form a fourth modified layer, not depicted, radially inwardly and upwardly of the third modified layer 72*c*, and to join the third modified layer 72*c* and the fourth modified layer to each other with cracks 74.

At this time, a line interconnecting the third modified layer 72*c* and the fourth modified layer is adjusted to form a depression angle ranging from 30 to 80 degrees toward the outer circumferential portion of the bonded wafer 2 with a line parallel to the plane of the bonded wafer 2. The focused spot FP applied to form the fourth modified layer may be identical in vertical position, i.e., thicknesswise position in the bonded wafer 2, to the second modified layer 72*b*. The fourth modified layer makes the cracks 74 in the bonding layer 8 extend further toward the outer circumferential portion of the bonded wafer 2.

Figure 12:
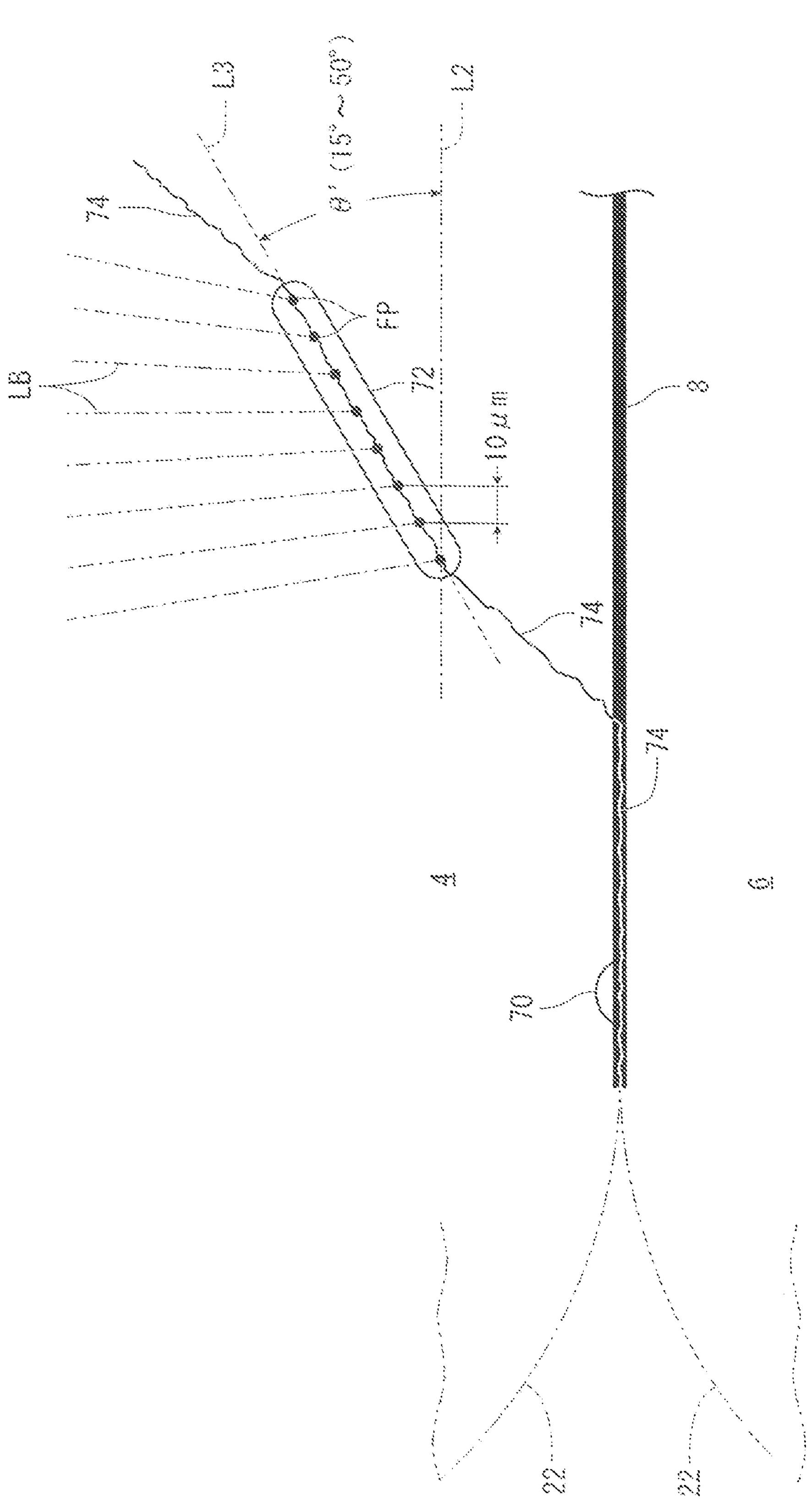
FIG. 12 is an enlarged fragmentary side elevational view illustrating the multi-focused spots of laser beam branches.

It has been described thus far by way of example that a modified layer 72 is formed by a single focused spot FP. In the modified layer forming step, however, as illustrated in FIG. 12, the multi-focused spots FP (a plurality of focused spots FP) of laser beam branches LB may be positioned in the first wafer 4 to form a flat modified layer 72 therein.

A positional relation between the focused spots FP and the bonding layer 8 is preferably adjusted such that the distance of the focused spots FP from the bonding layer 8 is progressively smaller in a direction from the center of the bonded wafer 2 toward the outer circumferential portion of the bonded wafer 2. Specifically, as illustrated in FIG. 12, a positional relation is adjusted such that a line L3 interconnecting the focused spots FP forms a depression angle θ' ranging from 15 to 50 degrees (15°≤θ'≤50°) toward the outer circumferential portion of the bonded wafer 2 with a line L2 parallel to the plane of the bonded wafer 2.

On the one hand, if the depression angle θ' is smaller than 15 degrees, then the cracks 74 tend to extend in a direction, i.e., a lateral direction, parallel to the plane of the bonded wafer 2, and the cracks 74 extending from the lower end of the modified layer 72 are liable to fail to reach the bonding layer 8.

On the other, if the depression angle θ' is larger than 50 degrees, then the cracks 74 tend to extend in a thicknesswise direction, i.e., a vertical direction, of the bonded wafer 2 and to be developed beyond the bonding layer 8 into the second wafer 6, possibly damaging the second wafer 6.

It is thus desirable to adjust the line L3 interconnecting the focused spots FP (multi-focused spots) to form the depression angle θ' ranging from 15 to 50 degrees toward the outer circumferential portion of the bonded wafer 2. Adjacent ones of the focused spots FP may be spaced from each other by an interval of approximately 10 μm in directions parallel to the plane of the bonded wafer 2. Regarding the number of the focused spots FP, they should preferably be eight or more focused spots FP. The focused spots FP are interconnected by cracks 74.

After the modified layer forming step has been carried out, a grinding step is carried out to hold the second wafer 6 of the bonded wafer 2 on a chuck table and grind the reverse side 4*b* of the first wafer 4 to thin down the first wafer.

Figure 14:
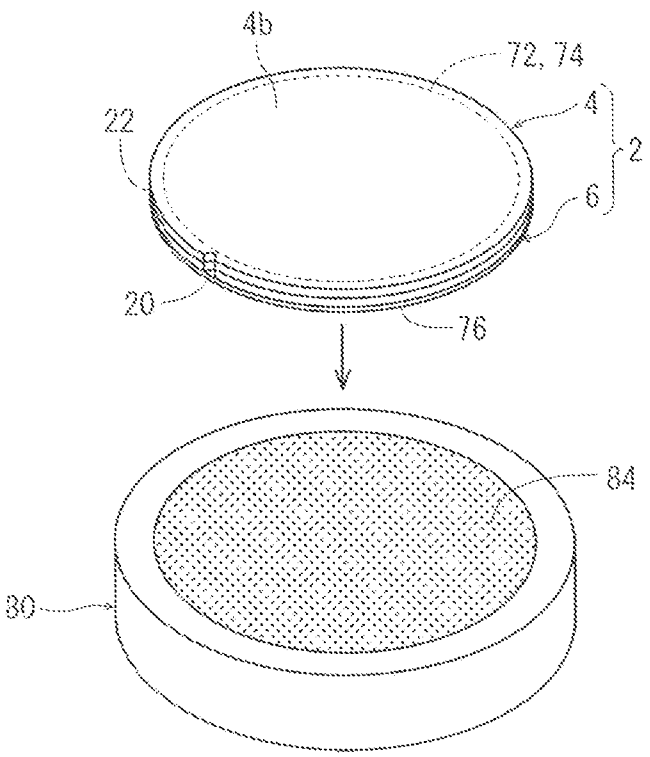
FIG. 14 is a perspective view illustrating the manner in which the bonded wafer is placed onto a chuck table of a grinding apparatus.
Figure 15:
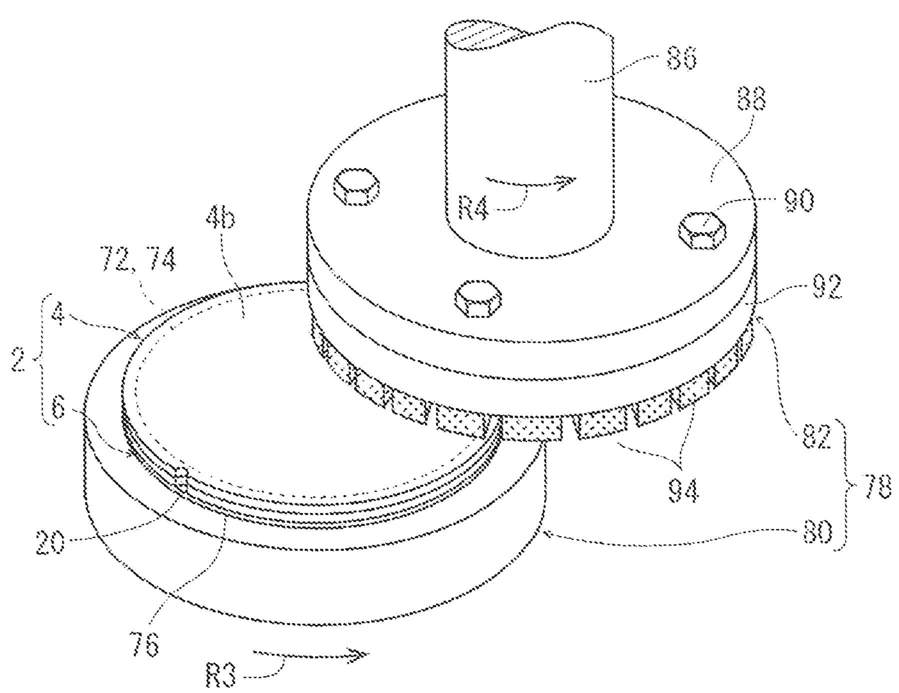
FIG. 15 is a perspective view illustrating a grinding step.

The grinding step is carried out using a grinding apparatus 78 illustrated in FIGS. 14 and 15. The grinding apparatus 78 includes a chuck table 80 (see FIGS. 14 and 15) for holding the bonding layer 8 under suction thereon and a grinding unit 82 (see FIG. 15) for grinding the bonded wafer 2 held under suction on the chuck table 80.

As illustrated in FIG. 14, a circular porous suction chuck 84 that is fluidly connected to suction means, not depicted, is disposed on the upper end of the chuck table 80. The chuck table 80 holds under suction the bonded wafer 2 that is placed on the upper surface of the suction chuck 84 under a suction force that is generated by the suction means and transmitted to the upper surface of the suction chuck 84. The chuck table 80 is rotatable about its vertical central axis by a chuck table motor, not depicted.

As illustrated in FIG. 15, the grinding unit 82 includes a spindle 86 extending vertically and a wheel mount 88 shaped as a circular plate fixed to the lower end of the spindle 86. The spindle 86 is vertically movable by a lifting and lowering mechanism, not shown, and is also rotatable about its vertical central axis by a spindle motor, not shown. An annular grinding wheel 92 is fastened to a lower surface of the wheel mount 88 by a plurality of bolts 90. The grinding wheel 92 has a lower surface including an outer circumferential edge portion to which there are fixed a plurality of grindstones 94 arranged in an annular array at circumferentially spaced intervals.

Figure 13:
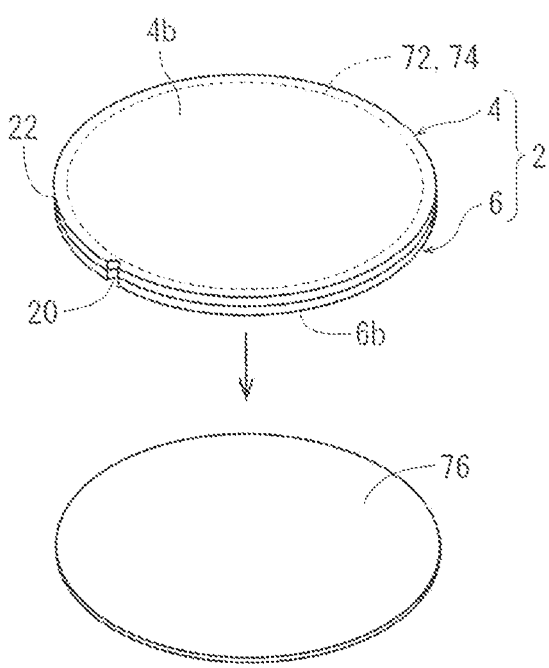
FIG. 13 is a perspective view illustrating the manner in which a protective tape is affixed to a second wafer of the bonded wafer.

As illustrated in FIG. 13, in the grinding step, it is preferable to affix a protective tape 76 to the exposed surface of the second wafer 6, i.e., the reverse side 6*b* of the second wafer 6 according to the present embodiment. However, the protective tape 76 may or may not be affixed to the exposed surface of the second wafer 6, i.e., the reverse side 6*b* of the second wafer 6.

Then, with the reverse side 4*b* of the first wafer 4 facing upwardly, the second wafer 6 is held under suction on the upper surface of the suction chuck 84 of the chuck table 80 (see FIG. 14). Thereafter, as illustrated in FIG. 15, the chuck table 80 is rotated about its central vertical axis in the direction indicated by an arrow R3 at a predetermined rotational speed of 300 rpm, for example. At the same time, the spindle 86 is rotated about its vertical central axis in the direction indicated by an arrow R4 at a predetermined rotational speed of 6000 rpm, for example.

Then, the spindle 86 is lowered to bring the grindstones 94 into contact with the reverse side 4*b* of the first wafer 4, and at the same time the region of the reverse side 4*b* that is contacted by the grindstones 94 is supplied with grinding water. Thereafter, the spindle 86 is lowered at a predetermined grinding feed rate of 1.0 μm/s, for example, causing the grindstones 94 to grind the reverse side 4*b* of the first wafer 4 to a predetermined depth.

Figure 16A:
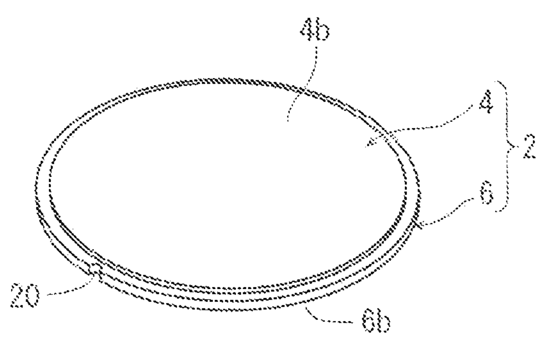
FIG. 16A is a perspective view of the bonded wafer from which a chamfered edge of a first wafer of the bonded wafer has been removed.
Figure 16B:
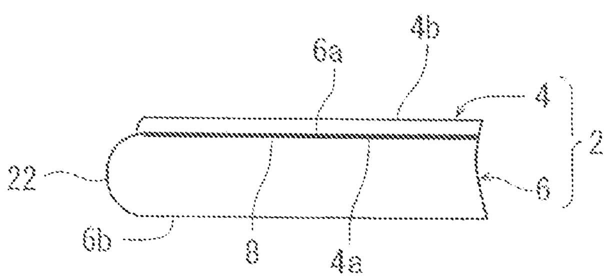
FIG. 16B is an enlarged fragmentary side elevational view of the bonded wafer illustrated in FIG. 16A.

As a result, as illustrated in FIG. 16, the first wafer 4 is thinned down to a desired depth in the range from 30 to 50 μm, for example. At the same time, a portion of the first wafer 4 that is radially outwardly of the removal initiating point, i.e., the modified layers 72 and the cracks 74, is removed from the first wafer 4. In other words, the chamfered edge 22 is removed from the first wafer 4.

In the method of processing a bonded wafer according to the present embodiment, as described above, the modified layers 72 are formed in the bonded wafer 2 at positions spaced in a thicknesswise direction of the bonded wafer 2 radially inwardly from the outer circumferential portion of the bonded wafer 2, and the modified layers 72 are joined to each other by the cracks 74, forming the removal initiating point for removing the chamfered edge 22 from the bonded wafer 2. The line L1 interconnecting the modified layers 72 forms the depression angle θ in the range from 30 to 80 degrees toward the outer circumferential portion of the bonded wafer 2.

Then, the grinding step is carried out on the bonded wafer 2 with the removal initiating point formed therein, thereby removing the chamfered edge 22 that is positioned radially outwardly of the removal initiating point. The method of processing a bonded wafer according to the present embodiment is able to remove the chamfered edge 22 more efficiently than the conventional removing process.

According to the present embodiment, furthermore, while the focused spots FP are being positioned radially inwardly of the voids 70, the laser beam branches LB are applied to the first wafer 4 to form the removal initiating point for removing the chamfered edge 22. When the modified layer forming step and the grinding step are carried out, therefore, the voids 70 as well as the chamfered edge 22 can be removed from the first wafer 4 along the removal initiating point provided by the modified layers 72 and the cracks 74. It is thus possible to prevent problems that would otherwise be caused by remaining voids 70, such as damage to the bonded wafer 2 and chippings upon dicing of the bonded wafer 2, from occurring.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a bonded wafer including a first wafer and a second wafer that are bonded to each other by a bonding layer interposed therebetween, the first wafer having on a face side thereof a device region where a plurality of devices are fabricated and an outer circumferential excessive region surrounding the device region and having a chamfered outermost circumferential edge, and the face side being bonded to the second wafer by the bonding layer, the method comprising:

a modified layer forming step of applying a laser beam having a wavelength transmittable through the first wafer to the first wafer from a reverse side thereof while positioning a focused spot of the laser beam within the first wafer to form a modified layer in the first wafer and cracks developed from the modified layer and extending toward an outer circumferential portion of the first wafer along the bonding layer; and, after the modified layer forming step, a grinding step of holding the second wafer on a chuck table and grinding the reverse side of the first wafer to thin down the first wafer, wherein, in the modified layer forming step, a plurality of modified layers are formed in the first wafer at positions spaced in a thicknesswise direction of the first wafer radially inwardly from the outer circumferential portion of the first wafer, and a line interconnecting the modified layers forms a depression angle ranging from 30 to 80 degrees toward the outer circumferential portion of the first wafer, the modified layers being joined to each other by cracks to form a removal initiating point for removing the chamfered outermost circumferential edge.

2. The method of processing a bonded wafer according to claim 1, a plurality of the modified layers are spaced at an interval in a range from 10 to 380 μm thicknesswise across the first wafer.

3. The method of processing a bonded wafer according to claim 1, wherein, in the modified layer forming step, a plurality of the modified layers are formed at positions spaced parallel to a plane of the first wafer radially inwardly from the outer circumferential portion of the first wafer, and the cracks are developed in and along the bonding layer toward the outer circumferential portion of the first wafer.

4. The method of processing a bonded wafer according to claim 3, wherein the modified layers spaced parallel to the plane of the first wafer are spaced at an interval in a range from 450 to 800 μm along the plane of the first wafer.

5. The method of processing a bonded wafer according to claim 1, wherein the focused spot of the laser beam includes multi-focused spots to form the modified layer.

* * * * *